US009368218B2

(12) United States Patent
Ziperovich

(10) Patent No.: US 9,368,218 B2
(45) Date of Patent: Jun. 14, 2016

(54) FAST SECURE ERASE IN A FLASH SYSTEM

(71) Applicant: HGST Netherlands B.V., Amsterdam (NL)

(72) Inventor: Pablo A. Ziperovich, San Diego, CA (US)

(73) Assignee: HGST NETHERLANDS B.V., Amsterdam (NL)

( * ) Notice: Subject to any disclaimer, the term of this patent is extended or adjusted under 35 U.S.C. 154(b) by 0 days.

(21) Appl. No.: 14/506,488

(22) Filed: Oct. 3, 2014

(65) Prior Publication Data

US 2016/0099061 A1 Apr. 7, 2016

(51) Int. Cl.
  G11C 16/10 (2006.01)
  G11C 16/14 (2006.01)
  G11C 16/34 (2006.01)

(52) U.S. Cl.
  CPC ............ G11C 16/14 (2013.01); G11C 16/3445 (2013.01)

(58) Field of Classification Search
  CPC ................................. G11C 16/10; G11C 16/26
  USPC ........................................ 365/185.11, 185.24
  See application file for complete search history.

(56) References Cited

U.S. PATENT DOCUMENTS

| | | | | |
|---|---|---|---|---|
| 7,372,733 | B2 * | 5/2008 | Choi | G11C 16/16 365/185.11 |
| 7,551,479 | B2 * | 6/2009 | Cho | G11C 16/14 365/185.09 |
| 8,130,554 | B1 | 3/2012 | Linnell | |
| 8,250,380 | B2 | 8/2012 | Guyot et al. | |
| 8,364,888 | B2 | 1/2013 | Melik-Martirosian et al. | |
| 8,489,855 | B2 | 7/2013 | Schuette | |
| 8,533,853 | B2 | 9/2013 | Jones et al. | |
| 8,797,802 | B2 * | 8/2014 | Hung | G11C 16/14 365/185.19 |
| 8,898,375 | B2 * | 11/2014 | Hou | G06F 12/0246 365/220 |
| 8,995,898 | B2 * | 3/2015 | Umetsu | G03G 15/6585 399/341 |
| 2008/0253253 | A1 * | 10/2008 | Yokoi | G11B 7/0062 369/59.12 |
| 2012/0170370 | A1 * | 7/2012 | Lee | G11C 16/28 365/185.17 |
| 2012/0254515 | A1 * | 10/2012 | Melik-Martirosian | G11C 16/14 711/103 |
| 2012/0278564 | A1 | 11/2012 | Goss et al. | |
| 2012/0278579 | A1 | 11/2012 | Goss et al. | |
| 2013/0003437 | A1 * | 1/2013 | Siau | G11C 11/5685 365/148 |

(Continued)

OTHER PUBLICATIONS

Wei, et al., "Reliably erasing data from flash-based solid state drives," FAST 11 Proceedings of the 9$^{th}$ USENIX conference on File and storage technologies, 2011, Abstract.

(Continued)

*Primary Examiner* — Michael Tran
(74) *Attorney, Agent, or Firm* — McDermott Will & Emery LLP

(57) ABSTRACT

A flash memory controller is configured to provide a first erase mode for erasing one or more groups of flash memory cells in a flash memory device using a plurality of erase pulses and a second erase mode for erasing the one or more groups of flash memory cells using a single erase pulse. The controller may receive a fast erase signal to erase the one or more groups of flash memory cells and, in response to the signal, switch operating parameters of the flash memory device from first parameters corresponding to the first erase mode to second parameters corresponding to the second erase mode, and instruct the flash memory device to perform an erase operation on the one or more groups of flash memory cells according to the second parameters. The controller may then verify that the erase operation was completed using the single erase pulse.

20 Claims, 8 Drawing Sheets

(56) References Cited

U.S. PATENT DOCUMENTS

| | | | | |
|---|---|---|---|---|
| 2013/0242665 | A1* | 9/2013 | Hung | G11C 16/14 365/185.19 |
| 2014/0022849 | A1 | 1/2014 | Krutzik et al. | |
| 2014/0269068 | A1* | 9/2014 | D'Abreu | G11C 16/3495 365/185.11 |

OTHER PUBLICATIONS

Wu, et al., "Reducing SSD Read Latency via NAND Flash Program and Erase Suspension," http://static.usenix.org/events/fast/tech/full_papers/Wu.pdf, 2012.

Smart Storage Systems, "Erasing Data in Solid State Drives," White Paper WP002, Revision B, Feb. 2012.

Crandall, "SSD Data Wiping: Sanitize or Secure Erase SSDs?" Kingston Technologies, http://www.kingston.com/us/community/articledetail?ArticleId=10, visited Feb. 25, 2014.

Corsair, "How to Secure Erase Corsair SSDs with Parted Magic—Performance Hardware User's Guide," Version 1.0, Mar. 2010.

TeleCommunication Systrems,"TCS Space & Component Technology Proteus Plus—Solid State Drive" http://www.telecomsys.com/Libraries/Collateral_Documents/ProteusPLUS.sflb.ashx, 2012.

* cited by examiner

FAST SECURE ERASE IN A FLASH SYSTEM

BACKGROUND

In a flash memory device (for example, with NAND architecture), memory cells are grouped in strings, with each string including a set of transistors connected in series between a drain select transistor, connected to a bit line of the memory block, and a source select transistor, connected to a reference voltage distribution line. Each memory cell may include a floating-gate MOS transistor. When programming a memory cell, electrons are injected into the floating-gate, for example, by means of Fowler-Nordheim (F-N) Tunneling. The non-volatility of the cell is due to the electrons maintained within the floating-gate. Bits are stored by trapping charge on the floating gate (an electrically isolated conductor) which stores a logic value defined by its threshold voltage (read threshold) commensurate with the electric charge stored. When the cell is erased, the electrons in the floating gate are removed by quantum tunneling (a tunnel current) from the floating gate to, for example, the source and/or substrate.

SUMMARY

The subject technology relates to a method for quickly and efficiently erasing a flash memory device. According to various aspects, the method may include providing, by a flash memory controller, a first erase mode for erasing one or more groups of flash memory cells in the flash memory device using a plurality of erase pulses and a second erase mode for erasing the one or more groups of flash memory cells using a single erase pulse, receiving a fast erase signal to erase the one or more groups of flash memory cells, switching, by the flash memory controller, operating parameters of the flash memory device from first parameters corresponding to the first erase mode to second parameters corresponding to the second erase mode based on receiving the fast erase signal, and instructing the flash memory device to perform an erase operation to erase the one or more groups of flash memory cells according to the second parameters. Other aspects include corresponding systems, apparatuses, and computer program products for implementation of the computer-implemented method.

According to various aspects, a data storage system may include a plurality of memory cells and a controller coupled to the plurality of memory cells. The controller may be configured to provide a first erase mode for erasing memory cells of one or more of the flash memory devices using a plurality of erase pulses and a second erase mode for erasing the memory cells using a single erase pulse, receive a fast erase signal for erasing one or more respective memory blocks of one or more of the plurality of flash memory devices according to the second erase mode, switch operating parameters of the one or more flash memory devices from first parameters corresponding to the first erase mode to second parameters corresponding to the second erase mode based on receiving the fast erase signal, and instruct the one or more flash memory devices to perform an erase operation to erase the one or more respective memory blocks according to the second parameters.

According to various aspects, a computer program product (e.g., a firmware) may be tangibly embodied in a data storage device and comprise instructions. The instructions, when executed by the data storage device, may cause the data storage device to provide a first erase mode for erasing one or more blocks of flash memory cells in a flash memory using a plurality of erase pulses and a second erase mode for erasing the one or more blocks of flash memory using a single erase pulse, receive a fast erase signal to erase the one or more blocks of flash memory cells, switch, in response to the fast erase signal, operating parameters of the flash memory from first parameters corresponding to the first erase mode to second parameters corresponding to the second erase mode, and instruct the flash memory to perform an erase operation to erase the one or more blocks of flash memory cells according to the second parameters.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

DETAILED DESCRIPTION

Figure 1:
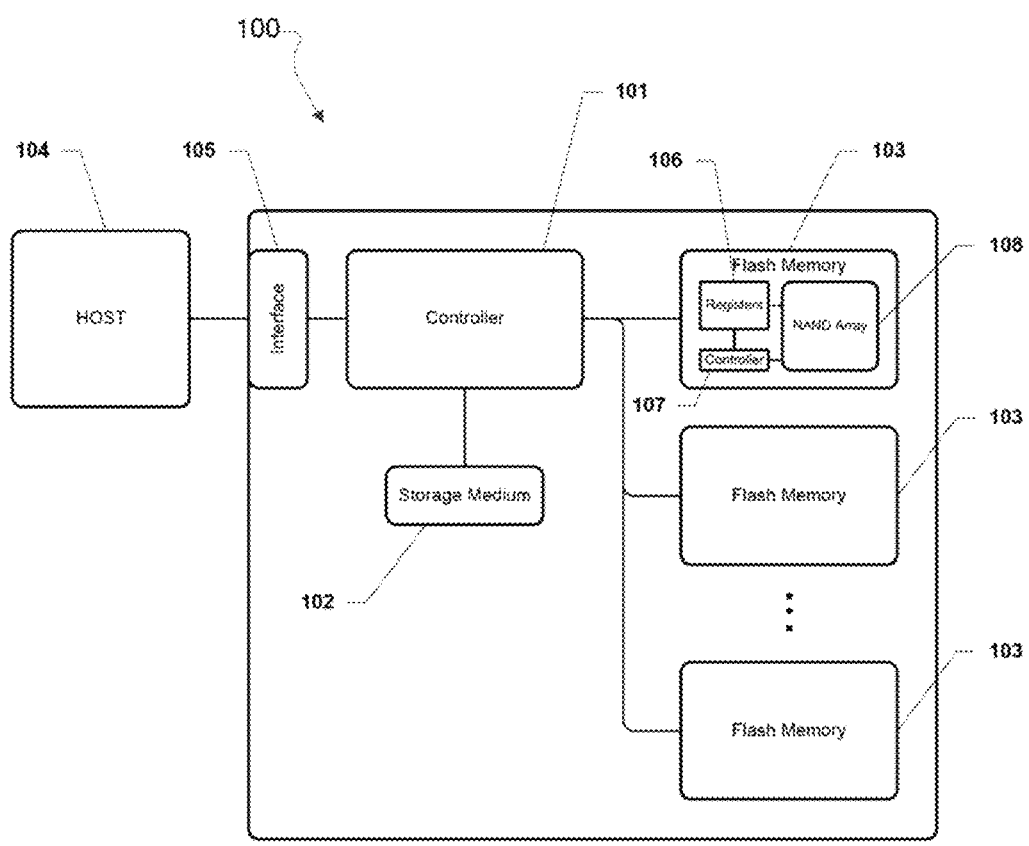
FIG. 1 is a block diagram depicting example components of an example data storage.

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, the present disclosure may be practiced without these specific details. In some instances, structures and components are shown in block diagram form in order to avoid obscuring the concepts of the present disclosure. Like components are labeled with identical element numbers for ease of understanding.

Data stored in NAND flash memory devices, for example, within solid state drives (SSDs) may be read over many programming and erase (P/E) cycles. A flash memory device is made up of a multitude of blocks, each having a particular block structure. For example, a block may include several memory cells (for storing, e.g., 2 Mbytes or more in data) which are all erased together in a single operation. The flash memory device, including its blocks, may be reliably read over many programming and erase (P/E) cycles. Accordingly, sensitive data, even if encrypted, could potentially be read by an unauthorized person obtaining access to the device and an encryption key for any encrypted data. A secure erase performs a full media erase and subsequent write of random data, thereby obliterating all sensitive data. The flash memory can then be used again to store data.

The secure erase, however, may use traditional processes, including the application of multiple incremental pulses to each memory cell, and then repeating for every block to perform the erase. In this regard, erasing every single flash block can take many minutes, since there may be many flash die with thousands of blocks in each die. Block erase times can range from 5 to 20 ms, therefore the time to serially erase all of the blocks in an SSD could take up to for example: 20 ms×4096 blocks×32 channels×2 dice=5,243 seconds (>87 minutes). In other aspects, unlike a traditional erase process wherein multiple erase pulses are used, a single pulse cannot be programmatically interrupted. In some aspects, interruption of an erase process that uses a single pulse may be accomplished by removing the SSD power supply. If the erase process is interrupted, NAND flash chips could be de-soldered from the board and sensitive data could be read out.

The subject technology provides a fast erase procedure for quickly and efficiently erasing a flash memory device, in which the time for erasing flash memory is dramatically reduced. Accordingly, an entire device may be erased in a fraction of the time it takes to do the same in traditional applications, minimizing the overall turn-around-time for the device, as well as allow for a fast erase under stressful conditions, such as in military applications. According to various implementations, two erase modes are provided by a memory controller: a first erase mode for erasing one or more groups of flash memory cells in the flash memory device using a plurality of erase pulses, and a second erase mode for erasing the one or more groups of flash memory cells using a single erase pulse. When the memory controller receives a fast erase signal (e.g., an emergency erase signal), the controller is configured to carry out operations to erase the one or more groups of flash memory cells using a single erase pulse (e.g., at a higher voltage than a first pulse of a regular erase mode). For the purposes of this disclosure a "fast erase signal" is distinguishable from a traditional erase signal for erasing memory cells using traditional erase methods (e.g., using a series of multiple incremental step pulses).

As will be described in further detail, the fast erase procedure includes, for example, switching the flash memory device from using the first erase mode to using the second erase mode for erasing the one or more groups of flash memory cells based on receiving a fast erase signal, and instructing the flash memory device to perform an erase operation. The erase operation is then performed using the second erase mode. The controller may then verify that the erase operation was completed using the single erase pulse, e.g., by monitoring an "operation complete" signal provided by the flash memory device. Once erased, the controller may then overwrite all addressable locations with a single bit or random data.

The subject technology reduces the amount of time to perform an erase of flash devices over traditional methods by up to a factor of twenty by using a single (e.g., 1 ms), high voltage pulse (e.g., over 25 volts) per block. Additionally, where other methods are destructive, e.g., crushing, incinerating, or otherwise making the memory useless, the subject technology applies an appropriately customized voltage that is not too high, thereby erasing the target memory without any significant impact or long term effects.

Flash blocks are erased by setting the memory element metal gate voltage at 0V, while bringing the substrate to a voltage high enough to assure complete erasure of the memory cells within the blocks. This results in electrons being removed from the memory element floating gate, thereby erasing its memory state. Block erasing is done by pulsing the substrate voltage with increasing voltages until all the cells are erased. In between these pulses, an internal read verify is done, e.g., by comparing the programmed cell voltages to an erase verify threshold voltage. If all the cells have been deemed erased, then the pulsing stops and the block is said to be erased. Every erase pulse and read verification takes about 1 ms, and usually 10-12 or more pulses are used to erase the block. The subject technology uses one high voltage pulse, thus saving 9 to 11 pulses, and resulting in an erase time of up to 20× shorter than traditional erase operations. The flash state machine is modified to allow only one erase pulse to be executed, and sets the voltage of this pulse to be higher than normal operation.

FIG. 1 is a block diagram depicting example components of an example data storage system 100 according to aspects of the subject technology. As depicted in FIG. 1, data storage system 100 (for example, a solid state drive) includes data storage controller 101, storage medium 102, and flash memory 103. Controller 101 may use storage medium 102 for temporary storage of data and information used to manage data storage system 100. Controller 101 may include several internal components (not shown) such as a read-only memory, a flash component interface (for example, a multiplexer to manage instruction and data transport along a serial connection to flash memory 103), an I/O interface, error correction circuitry, and the like. In some aspects, all of these elements of controller 101 may be integrated into a single chip. In other aspects, these elements may be separated on their own PC board.

Controller 101 may also include a processor configured to execute code or instructions to perform the operations and functionality described herein, manage request flow and address mappings, and to perform calculations and generate commands. The processor of controller 101 is configured to monitor and control the operation of the components in data storage controller 101. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 101 and/or its processor. One or more sequences of instructions may be software stored and read from storage medium 102, flash memory 103, or received from host device 104 (for example, via host interface 105). ROM, storage medium 102, flash memory 103, represent examples of machine or computer readable media on which instructions/code executable by controller 101 and/or its processor may be stored. Machine or computer readable media may generally refer to any medium or media used to provide instructions to controller 101 and/or its processor, including both volatile media, such as dynamic memory used for storage media 102 or for buffers within controller 101, and non-volatile media, such as electronic media, optical media, and magnetic media.

In some aspects, controller 101 is configured to store data received from a host device 104 in flash memory 103 in response to a write command from host device 104. Controller 101 is further configured to read data stored in flash memory 103 and to transfer the read data to host device 104 in response to a read command from host device 104. As will be described in more detail below, controller 101 is configured to, on determining certain operating conditions are present, perform a fast erase operation on a block and/or page of memory.

Host device 104 represents any device configured to be coupled to data storage system 100 and to store data in data storage system 100. Host device 104 may be a computing system such as a personal computer, a server, a workstation, a laptop computer, PDA, smart phone, and the like. Alternatively, host device 104 may be an electronic device such as a digital camera, a digital audio player, a digital video recorder, and the like.

In some aspects, storage medium 102 represents volatile memory used to temporarily store data and information used to manage data storage system 100. According to aspects of the subject technology, storage medium 102 is random access memory (RAM) such as double data rate (DDR) RAM. Other types of RAM also may be used to implement storage medium 102. Storage medium 102 may be implemented using a single RAM module or multiple RAM modules. While storage medium 102 is depicted as being distinct from controller 101, those skilled in the art will recognize that storage medium 102 may be incorporated into controller 101 without departing from the scope of the subject technology. Alternatively, storage medium 102 may be a non-volatile memory such as a magnetic disk, flash memory, peripheral SSD, and the like.

As further depicted in FIG. 1, data storage system 100 may also include host interface 105. Host interface 105 is configured to be coupled to host device 104, to receive data from host device 104 and to send data to host device 104. Host interface 105 may include both electrical and physical connections for operably coupling host device 104 to controller 101, for example, via the I/O interface of controller 101. Host interface 105 is configured to communicate data, addresses, and control signals between host device 104 and controller 101. Alternatively, the I/O interface of controller 101 may include and/or be combined with host interface 105. Host interface 105 may be configured to implement a standard interface, such as Serial-Attached SCSI (SAS), Fiber Channel interface, PCI Express (PCIe), SATA, USB, and the like. Host interface 105 may be configured to implement only one interface. Alternatively, host interface 105 (and/or the I/O interface of controller 101) may be configured to implement multiple interfaces, which are individually selectable using a configuration parameter selected by a user or programmed at the time of assembly. Host interface 105 may include one or more buffers for buffering transmissions between host device 104 and controller 101.

Flash memory 103 represents a non-volatile memory device for storing data. According to aspects of the subject technology, flash memory 103 includes, for example, a NAND flash memory. Flash memory 103 may include a single flash memory device or chip, or, as depicted by FIG. 1, may include multiple flash memory devices or chips arranged in multiple independent channels. Flash memory 103 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface may further hide the inner working of the flash memory and return only internally detected bit values for data. The interface of flash memory 103 may be used to access one or more internal registers 106 and an internal flash controller 107. In some aspects, registers 106 may include address, command, control, and/or data registers, which internally retrieve and output the necessary data to and from a NAND memory cell array 108. For example, a data register may include data to be stored in memory array 108, or data after a fetch from memory array 108, and may also be used for temporary data storage and/or act like a buffer. An address register may store the memory address from which data will be fetched to host 104 or the address to which data will be sent and stored. In some aspects, a command register may be included to control parity, interrupt control, and/or the like. In some aspects, internal flash controller 107 is accessible via a control register to control the general behavior of flash memory 103. Internal flash controller 107 and/or the control register may control the number of stop bits, word length, receiver clock source, and may also control switching the addressing mode, paging control, coprocessor control, and the like.

In some aspects, registers 106 may include a parameter register. The parameter register may, for example, be accessed by specific addresses and/or data combinations provided at the interface of flash memory 103 (for example, by specialized software provided by the manufacturer to perform various tests on the internal components of the flash memory). The parameter register may be used to access and/or modify other internal registers, for example, the command and/or control registers. In some aspects, modes accessible via the parameter register may be used to input or modify certain programming conditions of flash memory 103 (for example, erase parameters) to dynamically vary how data is programmed or erased from the memory cells of memory arrays 108 (e.g., to modify certain functions of flash memory 103).

Figure 2:
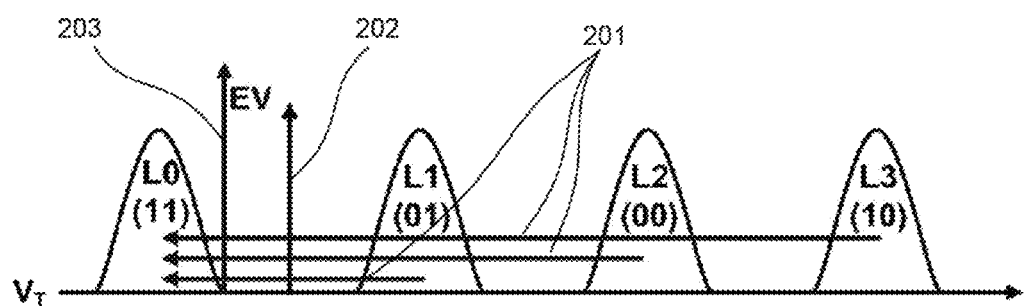
FIG. 2 is a graph diagram depicting example voltage evolutions of four possible distributions of memory cells in a MLC flash memory cell during an erase operation.

FIG. 2 is a graph diagram depicting example voltage evolutions of four possible (ideal) distributions of memory cells in a MLC flash memory cell during an erase operation according to aspects of the subject technology. A MLC cell (for example, a 2-bit NAND cell) may be programmed to one of four levels: an erased level, and three programmed levels. After one or more programming cycles, each group of cells programmed to a respective level may yield a distribution of cells (for example, about the programmed level). Accordingly, each group of cells may form a L0 distribution state (for example, binary 11), L1 distribution state (binary 01), L2 distribution state (binary 00), or L3 distribution state (binary 10).

In some aspects, a memory block may be programmed one page at a time using an Incremental Step Pulse Program (ISSP) and erased using a similar Incremental Step Pulse Erase (ISPE). The ISPP and/or ISPE may be performed by flash controller 107 in response to one or more instructions (for example, commands) received from controller 101. For example, using an ISPP, a page operation may be performed by applying a voltage at the gates of each cell in the memory page. A corresponding selection at the bit lines creates a voltage potential in the selected group of memory cells to create one or more distributions that are different than the erased L0 distribution state (for example, binary 11).

In the depicted example, memory cells in a 2-bit/cell (MLC) NAND flash memory are returned to an erased state (L0). In this regard, flash memory 103 may be instructed by controller 101 to perform an Incremental Step Pulse Erase (ISPE) procedure to apply a series of voltage pulses to the memory cells which are being erased. The amplitude polarity may be reversed (from ISPP) during the erase operation to remove electrons from the floating gates of the memory cells. The voltage evolution of such an erase operation is depicted in FIG. 2 by the arrows 201 representing cells of the L1 distribution, L2 distribution, and L3 distribution being returned to the L0 distribution state, with the voltage level of each cell falling below a threshold voltage 202 corresponding to an erased state (for example, zero volts). In some aspects, the status of the cells may be verified by applying an erase verify (EV) voltage 203 (for example, at a second threshold voltage) to confirm that the cells have indeed been erased. As described herein, the subject technology implements a pulse voltage high enough to return all cells in any given distribution to the erased (L0) distribution state in a single pulse.

Figure 3:
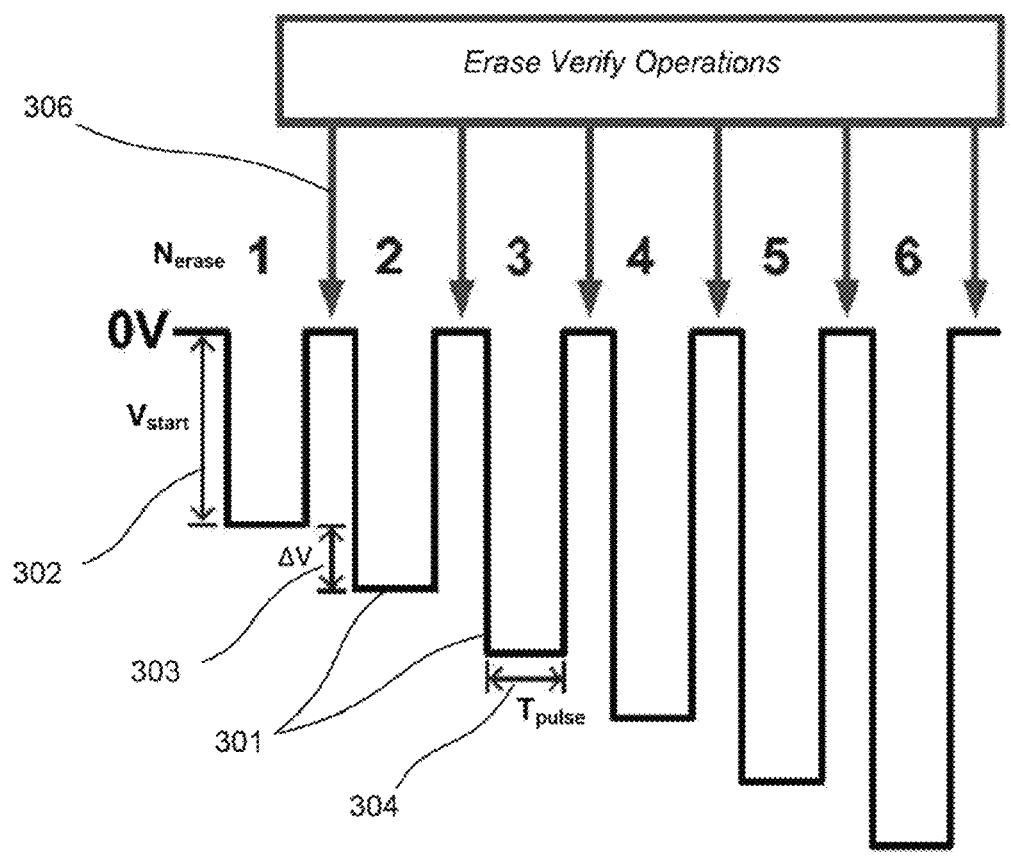
FIG. 3 is a graph diagram depicting an example erase operation procedure flow.

FIG. 3 is a graph diagram depicting an example erase operation procedure flow. An erase operation may include a series of voltage pulses 301 that are applied in a step pattern with the amplitude of each pulse incrementally increased with increasing pulse number ($N_{erase}$), starting from a starting pulse voltage ($V_{start}$) 302. Controller 101 may be configured to provide to flash memory 103 (for example, by setting one or more registers 106) one or more erase parameters to use in generating one or more of the erase pulses, including, for example, starting pulse voltage ($V_{start}$) 302, an amplitude increment ($\Delta V$) 303, a pulse width ($T_{pulse}$) 304, time between pulses, and the like. The erase parameters (some of which are depicted in FIG. 3), such as starting erase voltage $V_{start}$, voltage amplitude increment $\Delta V$, current erase pulse number $N_{erase}$, erase pulse width $T_{pulse}$, and maximum allowed number of erase pulses $N_{max}$, may be stored in several registers inside the NAND flash chip. In some aspects, an erase verify operation 306 may be executed after each pulse, or after a predetermined number of pulses, to verify whether the memory cell(s) targeted by the erase operation have been erased.

According to various implementations, the erase parameters may be defined separately for each pulse or series of pulses. The erase parameters may be set within a given flash memory device 103 by the manufacturer of the flash memory device. In some implementations, one or more of the erase parameters may be set via registers of flash memory device 103, for example, by controller 101. Given a manufacturer's specification for a particular type of flash memory it will be recognizable how to select the appropriate parameters as input to an ISPE to achieve an erased distribution (for example, L0 in FIG. 2) from a selected higher distribution (for example, L1, L2, or L3 in FIG. 2).

Figure 4:
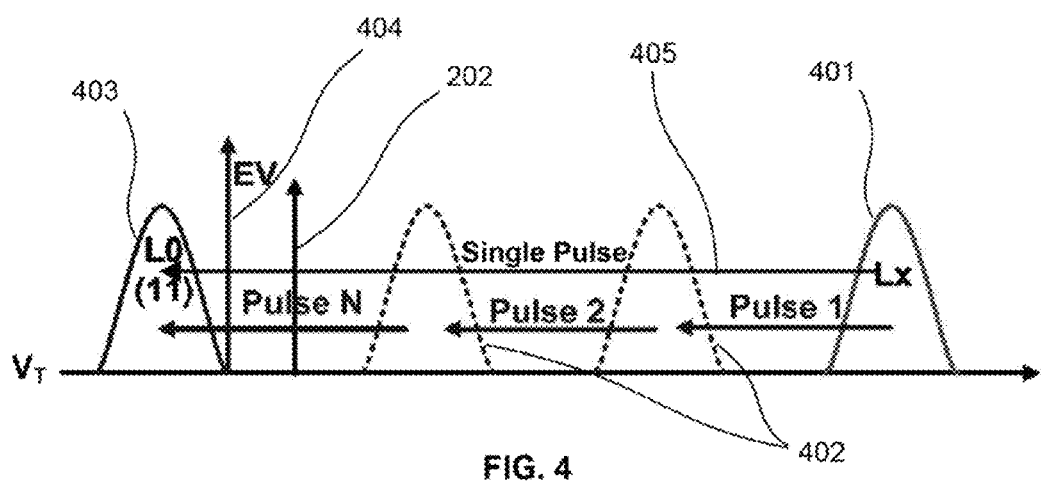
FIG. 4 is a graph diagram depicting an example erasure of a programmed threshold voltage distribution.

FIG. 4 is a graph diagram depicting an example erasure of a programmed threshold voltage distribution, according to various aspects of the subject technology. During SSD operation, controller 101 may instruct flash controller 107 to issue an erase command for a given memory block to start the ISPE procedure. Flash memory 103 may, as part of the ISPE, apply a number of erase pulses (for example, pulse 1 to pulse N) to the memory cells of the block to bring the memory cells to an erased state.

The example of FIG. 4 includes a distribution in an erased state L0, a distribution Lx, and two interim distributions depicted in dashed lines between distributions L0 and Lx. The depicted distributions are by way of example and are not intended to accurately represent the status of memory cells, or the status of the cells as pulses are applied in an erase operation. The depicted distributions of FIG. 4 may be generalizations of the distributions depicted in FIG. 2. For example, distributions L0, L1, L2, and L3 of FIG. 2 may be representative of the distributions depicted in FIG. 4.

During an erase operation, as erase pulses of increasing amplitude are applied, the programmed distributions may spread out as a very wide distribution, for example, between L0 to Lx. As more pulses are applied, the mean of the distribution will shift left until, when the erase operation is completed, all the pulses form the L0 distribution.

In a multi-pulse procedure, a programmed threshold voltage distribution (Lx) 401 may be incrementally shifted 402 to the left (to a lower value) with each pulse, until all of the cells in a block are sufficiently erased to populate the L0 distribution state 403, that is, have their threshold voltages below a predetermined erase verify (EV) level 404. At the conclusion of the procedure, flash memory 103 may return a "Pass" status, indicating that the erase operation is complete, or a "Fail" status, indicating that erase failed.

The pulse width, $T_{pulse}$, for an individual ISPE erase pulse may be on the order of 0.5 to 1.0 ms, and, the duration of the erase-verify operation may be on the order of 200 µs. Consequently, the total time required to perform a block erase operation may be on the order of 2.5 to 10 ms (for example, with an application of 5 to 20 erase pulses). A longer, milder erase operation may be performed using more erase pulses (for example, over 10 pulses), smaller negative voltage amplitude, and/or a longer pulse width to reduce the wear-out/degradation of the flash memory cells during cycling. In the case of an erase procedure initiated in an emergency, for example, to prevent unlawful acquisition of the data stored on flash memory 103, the longer the time required for an erase operation, the greater the possibility that the erase will be compromised or the data obtained before the erase can be completed.

Figure 5A:
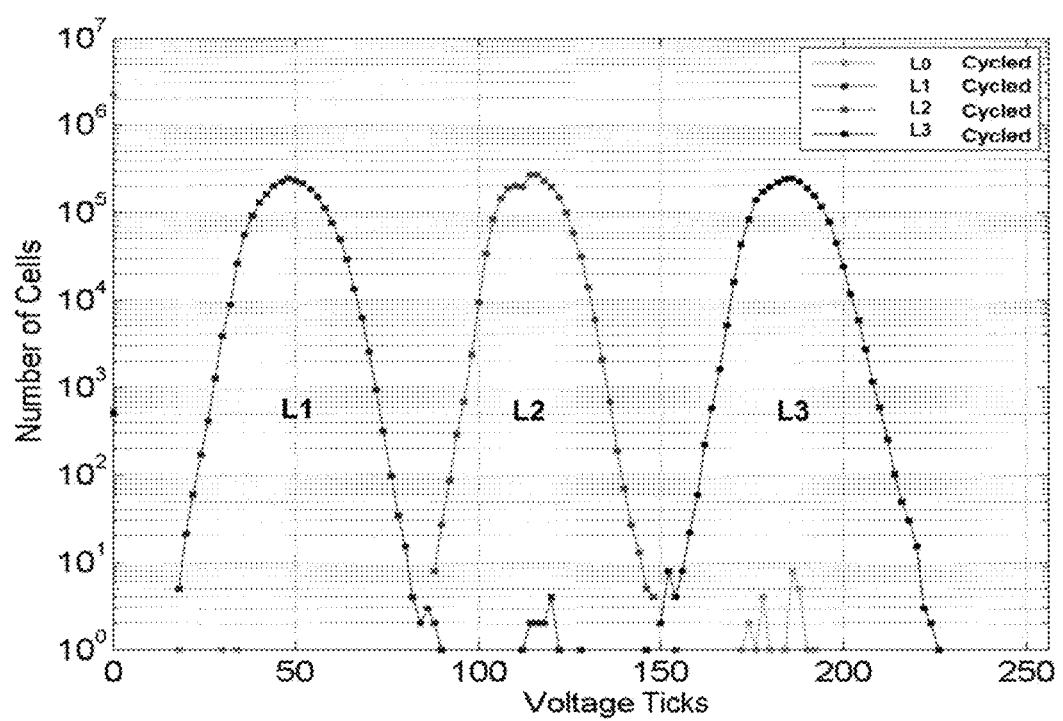
FIGS. 5A to 5G depict example cell charge distributions which are erased using a single pulse at different example voltages.

FIGS. 5A to 5G depict example memory cell charge distributions which are erased using a single pulse at different example voltages, according to various aspects of the subject technology. A group of memory cells may be programmed to generally even voltage distributions L0, L1, L2, and L3, as depicted by FIG. 2. FIG. 5A depicts distributions L1, L2, and L3 distributed between 20 and 225 voltage ticks (with every two ticks being representative of, e.g., 25 mV). Distribution L0 is not shown as it is generally located below 0 voltage ticks. As shown in FIG. 5A, a few cells that belong to the L0 and L1 distributions (erased state) have shifted right to higher levels after an amount of cycling.

Figure 5B:
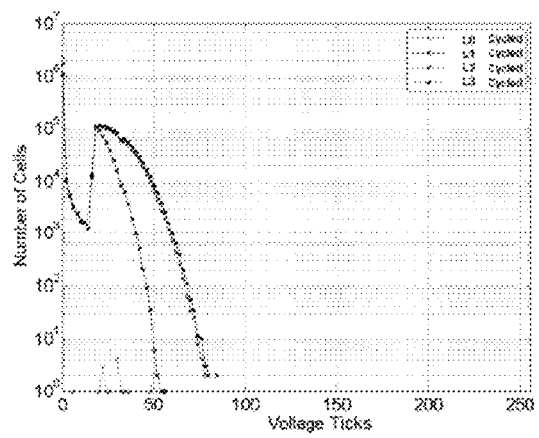

FIGS. 5B to 5F depict the status (and general shape) of the foregoing voltage distributions of FIG. 5A after a single high voltage pulse is applied to the memory cells. FIG. 5B depicts the status of the voltage distributions after a 10V pulse is applied to the memory cells. As shown in the depicted example, the distributions have shifted left, with distribution L1 having a maximum value of approximately 50 ticks, and distributions L2 and L3 each having a maximum value of approximately 75 ticks.

Figure 5C:
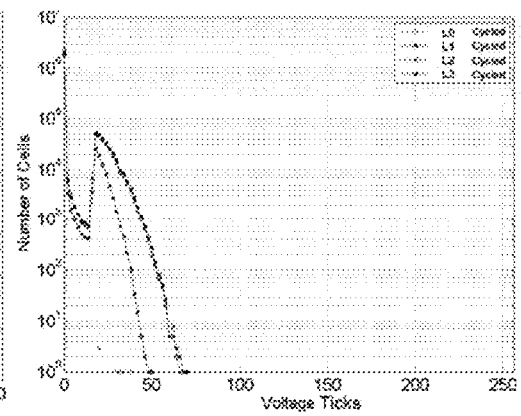
Figure 5D:
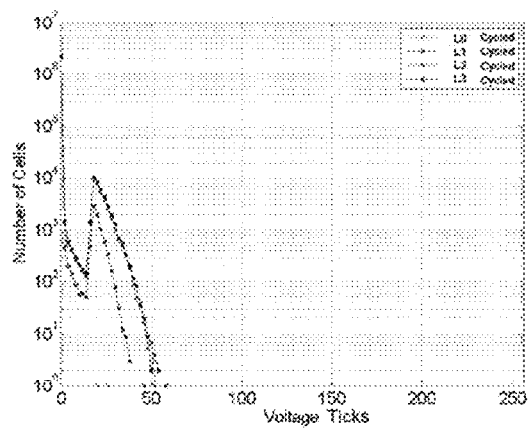
Figure 5E:
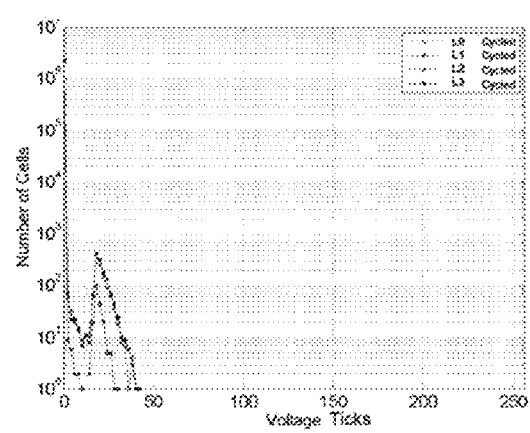
Figure 5F:
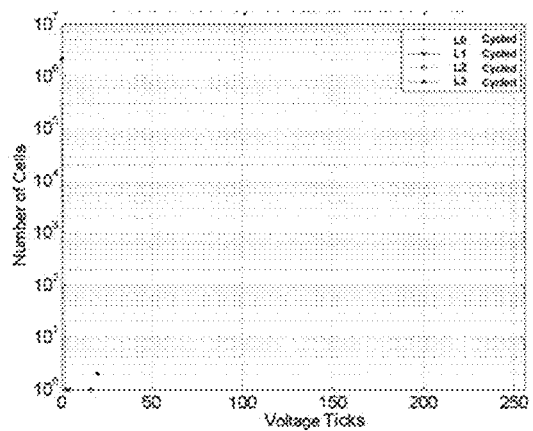
Figure 5G:
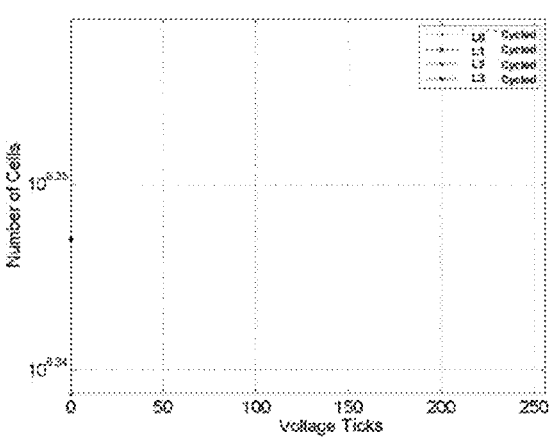

FIG. 5C depicts the status of the voltage distributions after a 13V pulse is applied, FIG. 5D depicts the status of the voltage distributions after a 16V pulse is applied, FIG. 5E depicts the status of the voltage distributions after a 19V pulse is applied, FIG. 5F depicts the status of the voltage distributions after a 22V pulse is applied, and FIG. 5G depicts the status of the voltage distributions after a 28V pulse is applied to the memory cells. As shown in the various examples, as the voltage is increased, the distributions shift further left, leaving fewer cells in a state other than the erased state. The example of FIG. 5G depicts a scenario in which all cells are reduced to the erased state in a single pulse.

Figure 6:
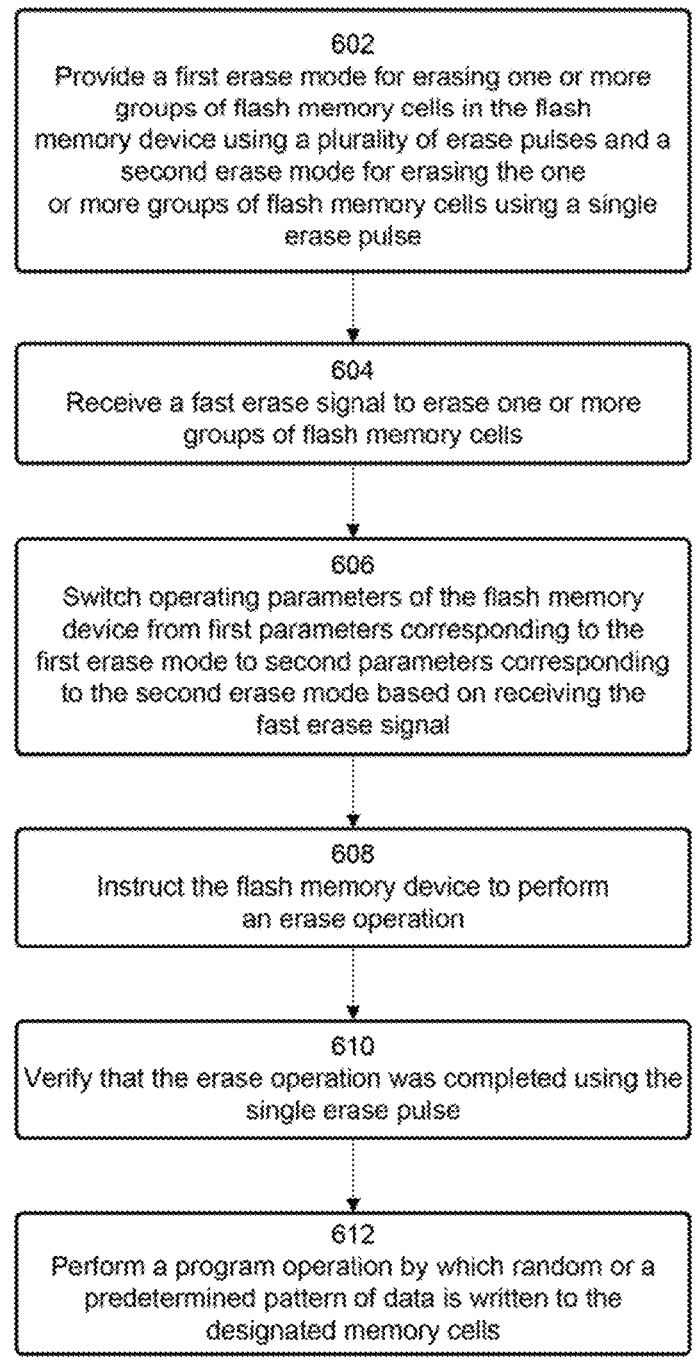
FIG. 6 depicts a flow diagram of an example process for quickly and efficiently erasing a flash memory device.

FIG. 6 depicts a flow diagram of an example process 600 for quickly and efficiently erasing a flash memory device according to various aspects of the subject technology. For explanatory purposes, the various steps of example process 600 are described herein with reference to the components and/or processes described herein. One or more of the steps of process 600 may be implemented, for example, by one or more processors, including, for example, controller 101 or one or more components or processors of controller 101. In some implementations, one or more of the steps may be implemented apart from other steps, and by one or more different processors or controllers. Further for explanatory purposes, the steps of example process 600 are described as occurring in serial, or linearly. However, multiple steps of example process 600 may occur in parallel. In addition, the steps of example process 600 need not be performed in the order shown and/or one or more of the steps of example process 600 need not be performed.

In the depicted example, controller 101 provides a first erase mode for erasing one or more groups of flash memory cells in flash memory device 103 using a plurality of erase pulses and a second erase mode for erasing the one or more groups of flash memory cells using a single erase pulse (602). In this regard, controller 101 may include firmware tangibly embodied therein that includes instructions for sending commands to one or more flash memory devices 103 operably connected to controller 101 in one or more flash channels. Accordingly, controller 101 may set certain operating parameters of flash memory device(s) 103 according to predetermined parameters for the first erase mode and the second erase mode. Controller 101 may set the operating parameters by programming the flash memory device(s), for example, using flash registers 106.

Data storage system 100 receives a fast erase signal (e.g., from host 104) to erase one or more groups of flash memory cells (604), for example, certain memory blocks in flash memory device 103. In military applications, a fast erase signal may be issued in response to an attack of or other imminent threat to the installation or vehicle upon which the flash memory resides. Accordingly, host 104 may issue a fast erase signal to quickly and reliably erase all non-volatile memory systems. The intent is to erase the memory before the overall system loses power and the non-volatile memory becomes subject to appropriation by a third party.

Flash memory device 103 may store (e.g., as metadata) a number of times that each block has been cycled, for example, a number of program/erase (P/E) cycles. A lookup table may be stored, for example in storage medium 102, that indexes P/E cycles and/or cycle ranges, and block addresses, with pulse voltages for use in the pulse erase operation. As the cycle count of a NAND block of flash memory increases a higher erase pulse voltage may be required to completely erase the block. Accordingly, a cycle count for a memory block may be correlated with how much voltage would be needed to erase memory cells of the block in one pulse. The data may be predetermined based on, for example, manufacturer specifications and/or previously conducted lab analysis. Table 1 depicts example parameters for storage in a lookup table for indexing erase pulse voltages based on cycle count. The value of these example parameters may directly relate to the erase start voltage.

TABLE 1

Erase Pulse Voltages Based On Cycle Count

| No. of Cycles | Starting Voltage for Die A | Starting Voltage for Die B | Starting Voltage for Die C | Starting Voltage for Die D | Improvement over traditional erase in no. of steps (at default ISPE voltage) |
|---|---|---|---|---|---|
| 10 | 33 | 33 | 33 | 34 | 7 |
| 10k | 39 | 39 | 39 | 40 | 9 |
| 20k | 42 | 42 | 42 | 43 | 10 |
| 30k | 48 | 45 | 45 | 46 | 13 |

In this regard, controller 101 may access the lookup table to obtain an erase voltage for applying to the memory cells in accordance with a fast erase operation, and then provide flash memory device 103 with the erase voltage. Flash memory device 103 may then carry out an pulse erase operation using a single pulse at the voltage provided by controller 101.

As depicted by Table 1, a lookup table may further be organized by die designation. In this manner, an optimal erase pulse voltage may be obtained for die having varying characteristics over expected lifetimes (e.g., determined by lab results). Example Table 1, illustrates that Die A has a higher erase pulse voltage at 30 k cycles than Die B. The last column of Table 1 provides an indication of efficiency over a traditional incremental step pulse erase procedure. For example, a traditional operation may use pulse increments of 3 volts. At 10 k cycles, a traditional operation may take up to 9 pulses to fully erase all memory cells in a die, whereby the subject technology erases the same amount of cells in a single pulse. As can be seen by the examples in Table 1, pulse erase voltages stored in a lookup table for using in a fast erase operation may increase with increasing cycle count. In some implementations, the subject technology may implement a lookup table based on each block in a flash memory device or die (e.g., by block address).

In response to the fast erase signal, controller 101 switches operating parameters of flash memory device 103 from first parameters corresponding to the first erase mode to second parameters corresponding to the second erase mode based on receiving the fast erase signal (606). In various implementations, an erase operation may be executed as an incremental stepping pulse erase operation. By default, flash memory device 103 may be configured to perform the incremental stepping pulse erase operation using the plurality of pulses at a first predetermined pulse voltage. In various implementations, controller 101 indexes the lookup table by block address and cycle count, and retrieves a new fast erase voltage. In some aspects, the indexing of voltage based on cycle count may be stored within the block itself, eliminating any need to index based on block address. Once the fast erase voltage is retrieved, controller 101 reprograms flash memory device 103 with the new fast erase voltage and sets the maximum erase pulse count for the incremental step pulse erase procedure equal to one.

Controller 101 instructs flash memory device 103 to perform an erase operation (608). Once programmed with the appropriate parameters for the fast erase mode, flash memory device may be instructed to carry out erase operations by issuing an erase command to the memory device. The erase operation is then performed using the second parameters consistent with the second erase mode. Controller 101 may erase one or multiple memory blocks in flash memory 103. In one or more implementations, each instruction for each memory block may include fast erase parameters for the block to be erased. In some implementations, where all memory blocks are to be erased, controller 101 may determine which blocks are to be erased using the same voltage, switch operating parameters of flash memory device 103 to the use the desired voltage and a single pulse, and then instruct flash memory 103 to sequentially erase each memory block until all the memory blocks are erased. Controller 101 may iteratively erase groups of blocks based on voltage for efficiency.

In some implementations, data storage system 100 may include multiple flash memory devices 103 and all devices may be the subject of a fast erase operation. In response to receiving the fast erase signal, controller 101 may instruct multiple flash memory devices 103 to perform the erase operation in parallel. Accordingly, controller 101 may perform an erase of flash memory devices by executing an erase of the same block address of each flash memory channel/ device at the same time, moving through each block address until all blocks of all flash memory devices 103 are erased.

Controller 101 then verifies that the erase operation was completed using the single erase pulse (610). Controller 101 may verify that the erase operation was performed, for example, merely by not receiving an erase fail notification. An erase verification may be performed automatically by flash memory device 103. For example, if the voltage is set too low then the block may return an erase failure. In that case, controller 101 may apply another pulse, automatically. Additionally or in the alternative, controller 101 may query flash memory device 103 to determine whether the device was indeed erased. Optionally, after the erase operation is complete, controller 101 may perform a program operation by which random or a predetermined pattern of data is written to the designated memory cells (612).

In certain aspects, the subject technology may include the implementation of different blocks or steps that those discussed above with respect to example process 600. Many of the above-described features of example process 600 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

Figure 7:
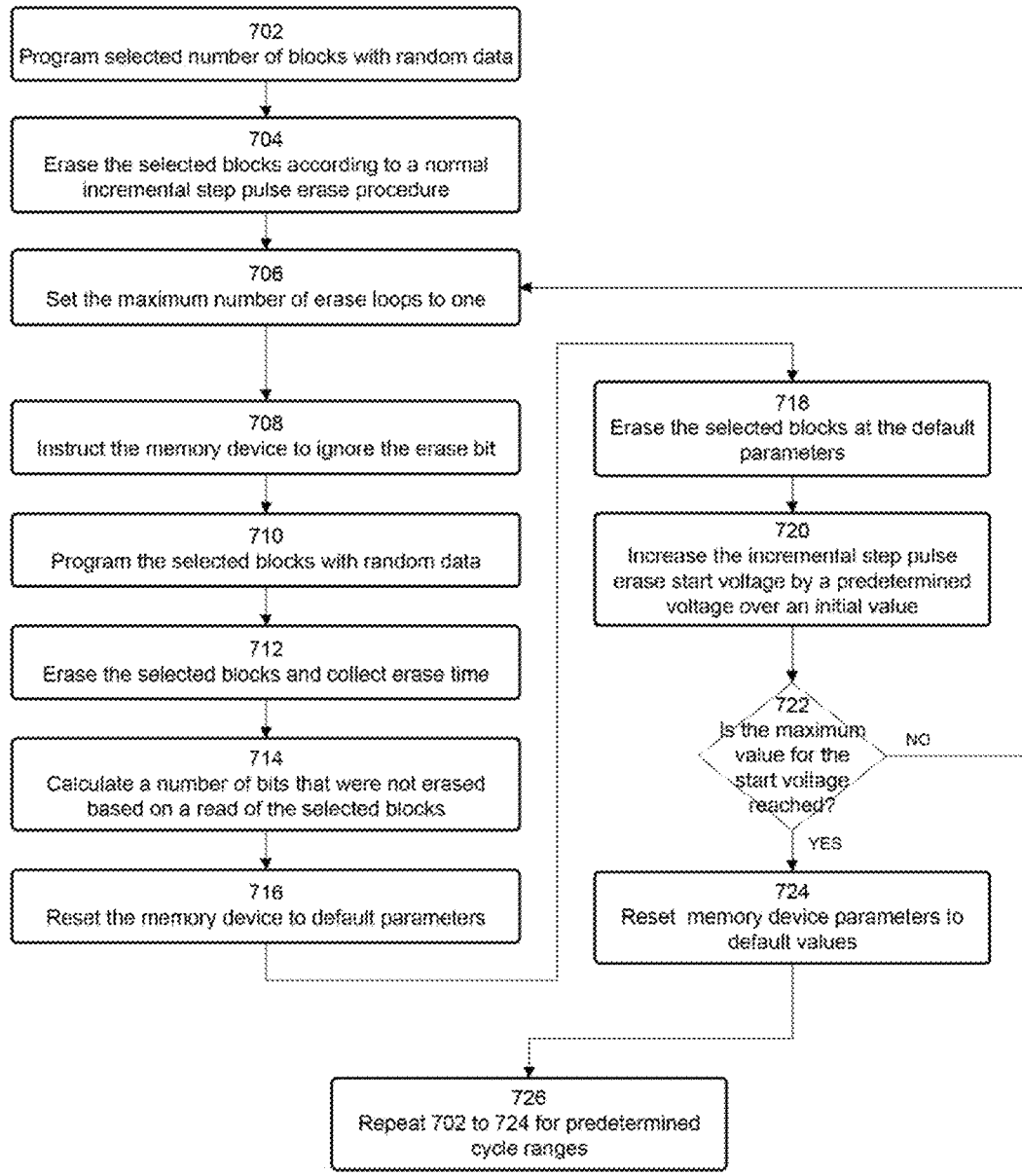
FIG. 7 depicts a flow diagram of an example process for determining a fast erase voltage for use in a flash memory device to quickly and efficiently erase the flash memory device.

FIG. 7 depicts a flow diagram of an example process 700 for determining a fast erase voltage for use in a flash memory device to quickly and efficiently erase the flash memory device according to various aspects of the subject technology. For explanatory purposes, the various blocks of example process 700 are described herein with reference to the components and/or processes described herein. The one or more of the blocks of process 700 may be implemented or facilitated, for example, by one or more processors and/or computing devices. Further for explanatory purposes, the blocks of example process 700 are described as occurring in serial, or linearly. However, multiple blocks of example process 600 may occur in parallel. In addition, the blocks of example process 700 need not be performed in the order shown and/or one or more of the blocks of example process 700 need not be performed.

The pulse voltages stored in the previously described lookup table and described with respect to Table 1 may be determined based on lab device characterization data. In this regard, a statistically significant population of flash memory devices received from a flash manufacturer may be repeatedly cycled and erased using a single pulse at varying voltages to generate lab data. The lab data is analyzed to determine an optimal voltage for a single pulse fast erase operation. Based on the lab data, a starting voltage for an incremental step pulse erase procedure may be determined so that a fast erase operation may be later performed on similar flash memory devices (e.g., having the same specifications, corner, etc.). In some aspects, a starting voltage in an incremental step pulse erase procedure may be the highest voltage possible regardless of its impact on the life of the flash memory device. In other aspects, a lower variable voltage may be determined by a cycle count of the flash memory device, or block therein.

The goal of process 700 is to determine a minimum erase pulse start voltage required to do a "fast and successful" erase of a particular flash memory device. Accordingly, determining the erase pulse voltage may include multiple steps. In the depicted example, a number of blocks (e.g., four) are selected from a single die (702). The blocks are then verified as being erased and, if not, erased according to a normal incremental step pulse erase procedure (704). The maximum number of erase loops is then sent to one (706) For example, a register storing a maximum number of erase loops may be set to a "1" value. The memory device is then instructed to ignore the erase bit (708) (e.g., change an erase-bit ignore register to "0").

The selected blocks are then programmed with random data (710). The blocks are erased, and the status of the erase operation determined to collect erase time for the block (712). A block read is then performed on the selected blocks and the number of bits that are not erased calculated (714). The memory device is then set back to default parameters (716) (e.g., the maximum number of erase loops and erase-bit ignore are set to their default values). The blocks are then erased and verified as to whether the erase was successful (718). The incremental step pulse erase start voltage is increased by a predetermined voltage (e.g., 3V) over an initial value (e.g., 3V) (720). Steps 606 through 620 are then repeated until a maximum value for the start voltage is reached (722). The memory device parameters may then be reset to default values (724), and steps 702 to 722 repeated for predetermined cycle ranges (e.g., cycling the selected blocks with random data for 10 k, 20 k, 30 k cycles) (726).

In one example implementation of process 700, flash memory devices from three non-consecutive lots are received. For example, the procedure may utilize fifty devices from each corner—one-hundred fifty devices total. A sample population is then taken out of each bucket, and each device characterized from cycling and performing single pulse erase operations to get a good distribution of data. The highest pulse voltage required to erase all cells in a distribution, including the worst case, is identified.

An additional "margin" voltage is added to the worse case. For example, 10-20% additional voltage may be added to the worst case to capture a tail of the distribution in actual operation of data storage system 100, even though the same voltage may not be required in the current distribution generated during the lab procedure. If the additional voltage does not capture cells at the end of a distribution in actual operation of the device (e.g., if the additional voltage is not used) then it may be accepted that one or more pulses may be applied. This may account for much less than 1% of the population of memory cells.

High voltages (including, e.g., the highest available voltage) have not been found to have a significant impact to the lifetime of a memory cell, particularly when the fast erase operation of the subject technology is only expected to be used in limited circumstances and/or under extreme conditions. The length of a fast erase pulse may be, for example, about 1 ms. This length may be similar to erase operations that do not use a fast erase. It may take some this amount of time to build up an electrical field for the pulse to be effective. In this regard, the length of the fast erase pulse may be set to values provided by the flash memory device manufacturer or supplier. In some aspects, it may be assumed that this fast secure erase operation is not performed often as continuously using this secure erase operation may result in degraded lifetime of the flash memory cells.

According to various aspects of the subject technology, the foregoing results generated from procedure 600 are stored in a lookup table for data storage system 100. Controller 101 is configured to select between two erase modes: a normal erase mode, and a fast (secure) erase mode when a fast erase signal is received by the controller. Controller 101 is configured to switch to the fast erase mode in response to receiving the signal. In this manner, controller 101, accesses the lookup table to retrieve a fast erase voltage for one or more designated blocks and for the current cycle count, and dynamically configures flash memory device 103 to use a single erase pulse at the fast erase voltage. The fast erase voltage is then applied to each respective block using a single erase pulse at the fast erase voltage to erase the block.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The term "software" is meant to include, where appropriate, firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the present disclosure or that such embodiment applies to all configurations of the present disclosure. A disclosure relating to an implementation may apply to all aspects, or one or more aspects. An implementation may provide one or more examples. A phrase such as an "embodiment" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for erasing information stored in a flash memory device, comprising:
 receiving a fast erase signal to erase one or more groups of flash memory cells in the flash memory device;
 switching, by a flash memory controller, operating parameters of the flash memory device from first parameters corresponding to a first erase mode to second parameters corresponding to a second erase mode based on receiving the fast erase signal, the first erase mode for erasing the one or more groups of flash memory cells using a plurality of erase pulses and the second erase mode for erasing the one or more groups of flash memory cells using a single erase pulse, wherein an erase operation in the first erase mode is an incremental stepping pulse erase operation and the flash memory device is configured to perform the erase operation in the first erase mode by default; and instructing the flash memory device to perform an erase operation to erase the one or more groups of flash memory cells according to the second parameters.

2. The method of claim 1, further comprising:
verifying that the erase operation was completed using the single erase pulse.

3. The method of claim 2, further comprising:
writing random data to the one or more groups of flash memory cells after the erase operation is completed.

4. The method of claim 1, wherein switching the operating parameters comprises:
obtaining a pulse voltage for the erase operation based on a current number of cycles for the one or more groups of flash memory cells; and
instructing the flash memory device to perform the erase operation using the obtained pulse voltage.

5. The method of claim 4, wherein obtaining the pulse voltage comprises:
indexing a lookup table by the current number of cycles to obtain the pulse voltage from the lookup table.

6. The method of claim 1, wherein each group of flash memory cells is arranged and addressed by the flash memory controller as a memory block, the method further comprising:
in response to receiving the fast erase signal, instructing the flash memory device to perform the erase operation, according to the second parameters, for all memory blocks in the flash memory device.

7. The method of claim 6, further comprising:
in response to receiving the fast erase signal, switching operating parameters of a plurality of flash memory devices from the first parameters to the second parameters, and instructing each of the plurality of flash memory devices to perform erase operations in parallel, according to the second parameters, to erase all memory blocks in each respective flash memory device.

8. A data storage system, comprising:
a plurality of flash memory devices, each flash memory device comprising a plurality of memory blocks; and
a controller coupled to the plurality of flash memory devices, wherein the controller is configured to:
erase memory cells of one or more of the flash memory devices using a first erase mode or a second erase mode, the first erase mode for erasing the memory cells using a plurality of erase pulses and the second erase mode for erasing the memory cells using a single erase pulse;
receive a fast erase signal for erasing one or more respective memory blocks of one or more of the plurality of flash memory devices according to the second erase mode;
switch operating parameters of the one or more flash memory devices from first parameters corresponding to the first erase mode to second parameters corresponding to the second erase mode based on receiving the fast erase signal, wherein an erase operation in the first erase mode is an incremental stepping pulse erase operation and each of the one or more flash memory devices is configured to perform the erase operation in the first erase mode by default; and
instruct the one or more flash memory devices to perform an erase operation to erase the one or more respective memory blocks according to the second parameters.

9. The data storage system of claim 8, wherein the controller is further configured to:
verify the erase operation was completed using the single erase pulse.

10. The data storage system of claim 8, wherein switching the operating parameters comprises:
obtaining an erase pulse voltage for the erase operation based on a current number of cycles for the one or more respective memory blocks; and
instructing the one or more of the flash memory devices to perform the erase operation using the obtained pulse voltage.

11. The data storage system of claim 10, wherein obtaining the erase pulse voltage comprises:
indexing a lookup table by the current number of cycles to obtain the erase pulse voltage from the lookup table.

12. The data storage system of claim 8, wherein the controller is further configured to:
write random data to the one or more respective memory blocks after the erase operation is completed.

13. The data storage system of claim 8, wherein the controller is further configured to:
in response to receiving the fast erase signal, instruct each of the one or more flash memory devices to perform the erase operation, according to the second parameters, for all memory blocks in the flash memory device.

14. The data storage system of claim 13, wherein the controller is further configured to:
in response to receiving the fast erase signal, switch operating parameters of the plurality of flash memory devices from the first parameters to the second parameters, and instruct each of the plurality of flash memory devices to perform erase operations in parallel, according to the second parameters, to erase all memory blocks in each respective flash memory device.

15. A computer program product tangibly embodied in a data storage device and comprising instructions that, when executed by the data storage device, cause the data storage device to:
receive a fast erase signal to erase one or more blocks of flash memory cells in a flash memory;
switch, in response to the fast erase signal, operating parameters of the flash memory from first parameters corresponding to a first erase mode to second parameters corresponding to a second erase mode, the first erase mode for erasing the one or more blocks of flash memory cells using a plurality of erase pulses and the second erase mode for erasing the one or more blocks of flash memory using a single erase pulse, wherein an erase operation in the first erase mode is an incremental stepping pulse erase operation and the flash memory device is configured to perform the erase operation in the first erase mode by default;
instruct the flash memory to perform an erase operation to erase the one or more blocks of flash memory cells according to the second parameters.

16. The computer program product of claim 15, wherein switching the operating parameters comprises:
indexing a lookup table by a current number of cycles for the one or more blocks; and obtaining a pulse voltage for the erase operation from the lookup table based on the current number of cycles.

17. The computer program product of claim 16, wherein the instructions, when executed by the data storage device, further cause the data storage device to:
   instruct the flash memory to perform the erase operation using the obtained pulse voltage; and
   verify that the erase operation was completed using the single erase pulse at the obtained pulse voltage.

18. The computer program product of claim 15, wherein the instructions, when executed by the data storage device, further cause the data storage device to:
   write random data to the one or more blocks of memory cells after the erase operation is completed.

19. The computer program product of claim 15, wherein the instructions, when executed by the data storage device, further cause the data storage device to:
   in response to receiving the fast erase signal, instruct the flash memory to perform the erase operation, according to the second parameters, for all memory blocks in the flash memory.

20. The computer program product of claim 19, wherein the instructions, when executed by the data storage device, further cause the data storage device to:
   in response to receiving the fast erase signal, switching operating parameters of multiple flash memory devices from the first parameters to the second parameters, and instruct the multiple flash memory to perform erase operations in parallel, according to the second parameters, for all memory blocks in each respective flash memory.

* * * * *